US006807662B2

(12) United States Patent
Toublan et al.

(10) Patent No.: US 6,807,662 B2
(45) Date of Patent: Oct. 19, 2004

(54) PERFORMANCE OF INTEGRATED CIRCUIT COMPONENTS VIA A MULTIPLE EXPOSURE TECHNIQUE

(75) Inventors: Olivier Toublan, Grenoble (FR); Serdar Manakli, Grenoble (FR); Yorick Trouiller, Grenoble (FR)

(73) Assignees: Mentor Graphics Corporation, Wilsonville, OR (US); STMicroelectronics Central Research and Development, Crolles (FR); C.E.A., Grenoble (FR)

( * ) Notice: Subject to any disclaimer, the term of this patent is extended or adjusted under 35 U.S.C. 154(b) by 0 days.

(21) Appl. No.: 10/192,186

(22) Filed: Jul. 9, 2002

(65) Prior Publication Data

US 2004/0010768 A1 Jan. 15, 2004

(51) Int. Cl.[7] .............................................. G06F 17/50
(52) U.S. Cl. ........................... 716/21; 716/19; 716/20; 430/5; 430/13; 430/14; 430/15
(58) Field of Search ............................ 716/1–21; 430/5, 430/13–15, 24, 25, 394, 396

(56) References Cited

U.S. PATENT DOCUMENTS

| 5,498,579 | A | | 3/1996 | Borodovsky et al. |
|---|---|---|---|---|
| 5,838,044 | A | | 11/1998 | Chang et al. |
| 6,130,750 | A | * | 10/2000 | Ausschnitt et al. .......... 356/401 |
| 6,453,452 | B1 | * | 9/2002 | Chang et al. ................... 716/8 |
| 6,537,867 | B1 | * | 3/2003 | Freyman et al. ............. 438/197 |
| 2002/0071997 | A1 | * | 6/2002 | Ahrens et al. .................. 430/5 |
| 2002/0155362 | A1 | * | 10/2002 | Heissmeier et al. ............ 430/5 |
| 2002/0192574 | A1 | * | 12/2002 | Heissmeier et al. ............ 430/5 |

* cited by examiner

*Primary Examiner*—Vuthe Siek
(74) *Attorney, Agent, or Firm*—Christensen O'Connor Johnson Kindness PLLC

(57) ABSTRACT

An initial layout of an integrated circuit device is separated into a set of definitions for use in a multiple exposure fabrication process. The separation begins with reading a portion of the initial layout and identifying one or more target features within the initial layout. Further, a first revised layout definition is created for a first mask and a second revised layout definition is created for a second mask. The first revised layout definition includes the target features inside the dark-field content. In addition, in one embodiment, the first revised layout definition includes clear areas around each target feature. The second layout definition includes one or more dark features inside the bright-field content. These dark features, when used in the multiple exposure fabrication process, will overlap the target features. The first and second masks may be binary masks, attenuated phase-shifting masks (PSMs) or a combination of a binary mask and an attenuated PSM.

66 Claims, 18 Drawing Sheets

DENSE

SEMI-DENSE

ISOLATED

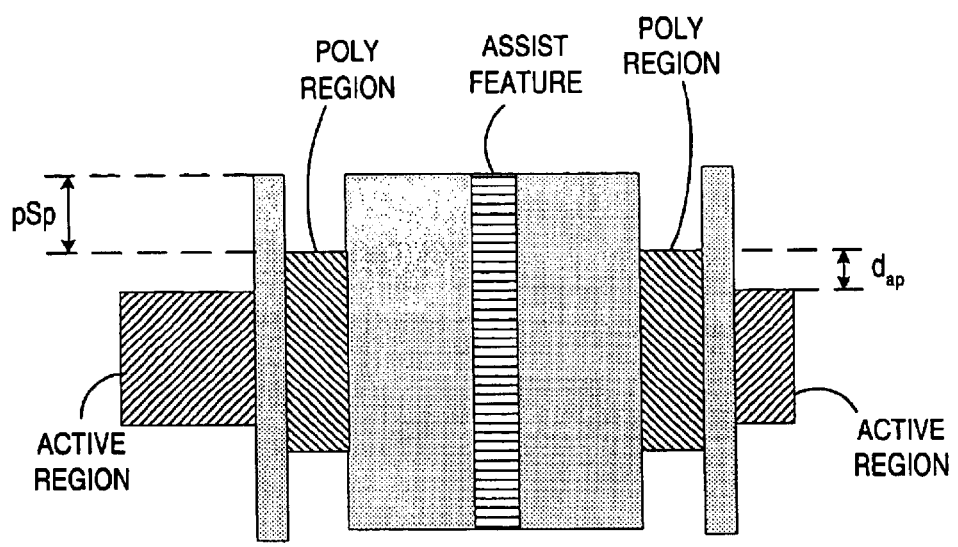
CREATION OF LAYOUT
FOR FIRST MASK
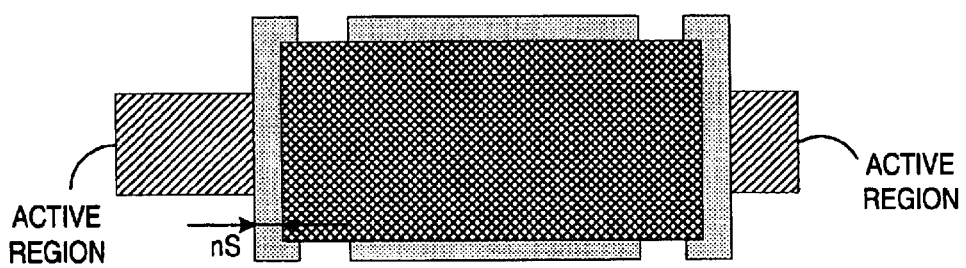
CREATION OF LAYOUT
FOR SECOND MASK
FIG. 7f

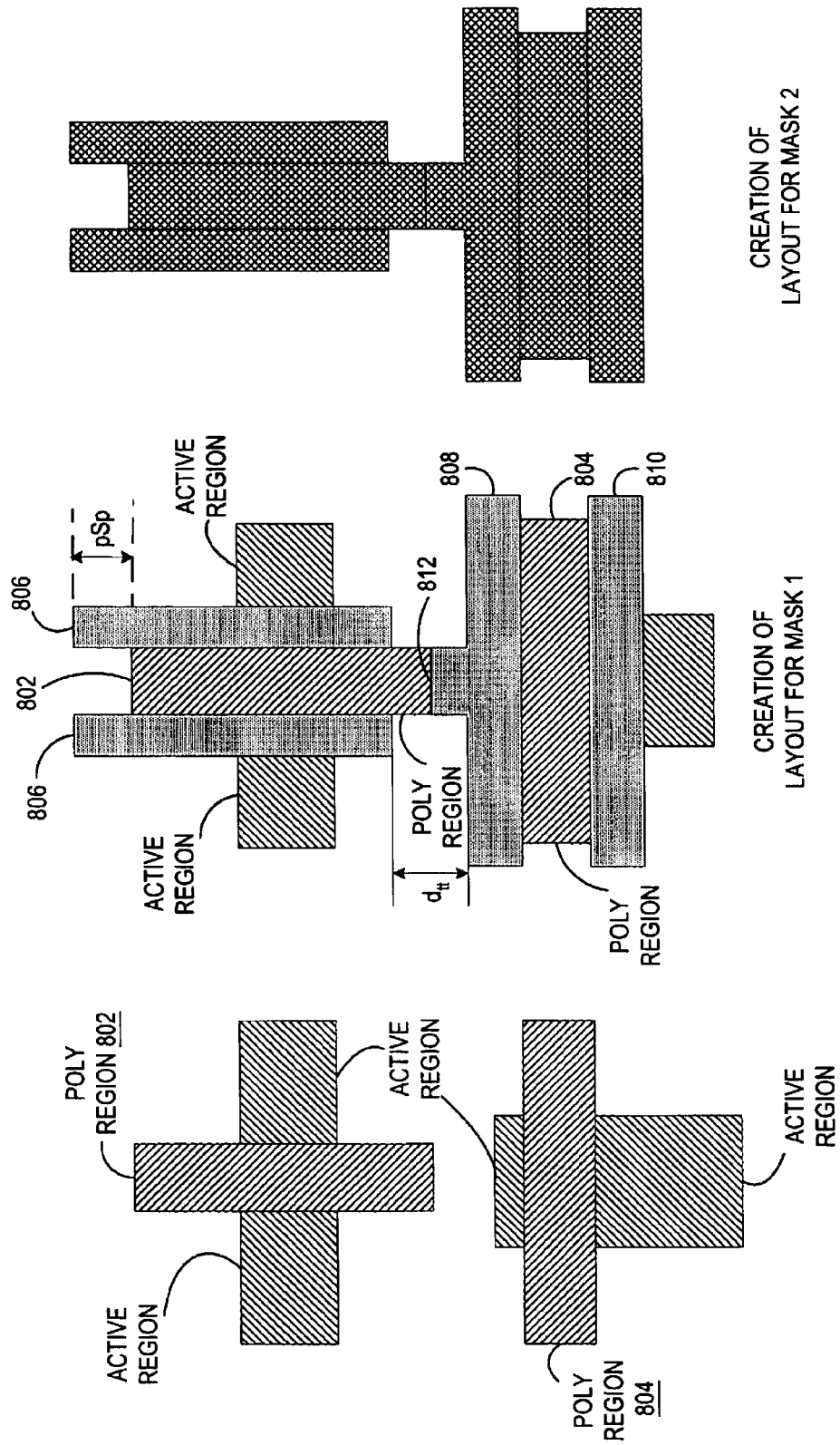

CREATION OF
LAYOUT FOR MASK 2

CREATION OF
LAYOUT FOR MASK 1

ORIGINAL LAYOUT

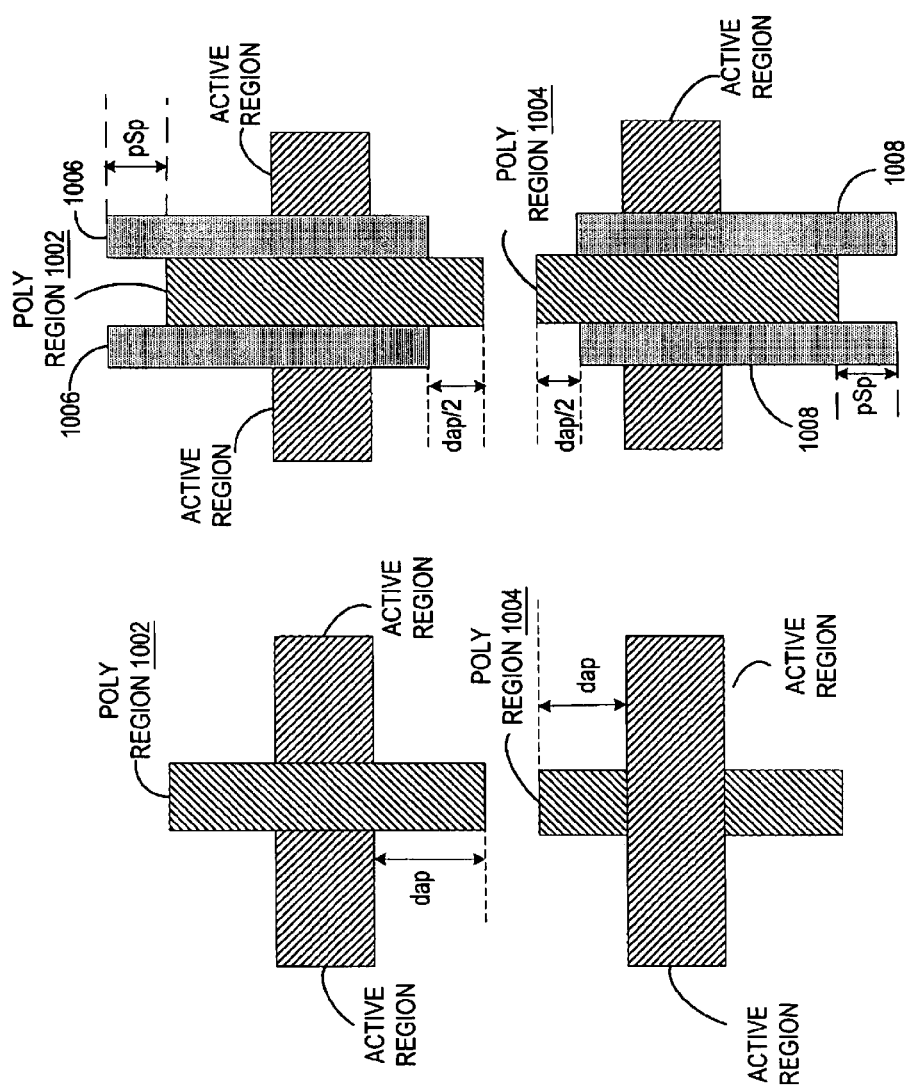

PERFORMANCE OF INTEGRATED CIRCUIT COMPONENTS VIA A MULTIPLE EXPOSURE TECHNIQUE

FIELD OF THE INVENTION

The invention relates to an integrated device design. More particularly, the invention relates to a multiple exposure technique that can be used in an integrated device design and manufacturing process.

BACKGROUND OF THE INVENTION

In the semiconductor industry, integrated circuit (IC) devices are fabricated by forming several device layers on a semiconductor substrate using lithographic methods to define the pattern of each layer. As integrated circuits (ICs) become more dense, the widths of lines and components become increasingly smaller. Shrinkage of IC device dimensions can make it difficult to print patterns by a single exposure. This difficulty usually arises with such features of IC devices as transistor gates that have especially small dimensions. In addition, transistor gates are laid out randomly across the device and are not surrounded sufficiently close by other features to provide the necessary periodicity for maximum resolution. One solution to resolution enhancement on the gate layer is the adoption of a multiple exposure technique.

Existing multiple exposure techniques utilize expensive phase-shifting masks (PSMs). For example, a common multiple-exposure technique uses an alternating PSM to print the desired feature and a trim mask to remove the residual image produced by the alternating PSM. Alternating PSMs are expensive because their fabrication requires additional steps for creating the 180-degree phase difference and also due to enhanced printing of small defects that are difficult to detect and repair. Accordingly, the cost associated with alternating PSMs may outweigh the benefit received from the double exposure fabrication process in terms of chip speed and performance. Thus, what is needed is an improved multiple-exposure technique that utilizes low-cost reticles.

SUMMARY OF THE INVENTION

An initial layout of an integrated circuit device is separated into a set of definitions for use in a multiple exposure fabrication process. The separation begins with reading a portion of the initial layout and identifying one or more target features within the initial layout. Further, a first revised layout definition is created for a first mask and a second revised layout definition is created for a second mask. The first revised layout definition includes the target features inside the dark-field content. In addition, in one embodiment, the first revised layout definition includes clear areas around each target feature. The second layout definition includes one or more dark features inside the bright-field content. These dark features, when used in the multiple exposure fabrication process, will overlap the target features. The first and second masks may be binary masks, attenuated phase-shifting masks (PSMs) or a combination of a binary mask and an attenuated PSM.

Other features of the present invention will be apparent from the accompanying drawings and from the detailed description that follows.

BRIEF DESCRIPTION OF THE DRAWINGS

The invention is illustrated by way of example, and not by way of limitation in the figures of the accompanying drawings in which like reference numerals refer to similar elements.

FIGS. 7A–7G illustrate exemplary mask layouts used for one-dimensional gate level structures, according to one embodiment of the present invention.

FIGS. 8A–10C illustrate exemplary mask layouts used for two-dimensional gate level structures, according to one embodiment of the present invention.

DETAILED DESCRIPTION

Methods and apparatuses for separating an initial layout of an integrated circuit device into a set of layout definitions for use in a multiple exposure fabrication process are described. These layout definitions are created for masks that modulate lithographic exposure in the multiple exposure fabrication process. Each mask may be a binary mask, an attenuated phase-shifting mask (attenuated PSM), or any other cost-efficient mask or reticle.

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Although the present specification utilizes the term "mask", it will be appreciated that the present invention is also applicable to systems that create photolithographic reticles, as well as for systems similar to mask writing systems that actually write patterns directly on wafers or other substrates. Therefore, as used herein, the term "mask" is intended to refer to both photolithographic masks and reticles as well as other structures that modulate lithographic exposure. Furthermore, although methods and apparatuses are described herein with respect to integrated circuit manufacturing, the techniques described can be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Figure 1:
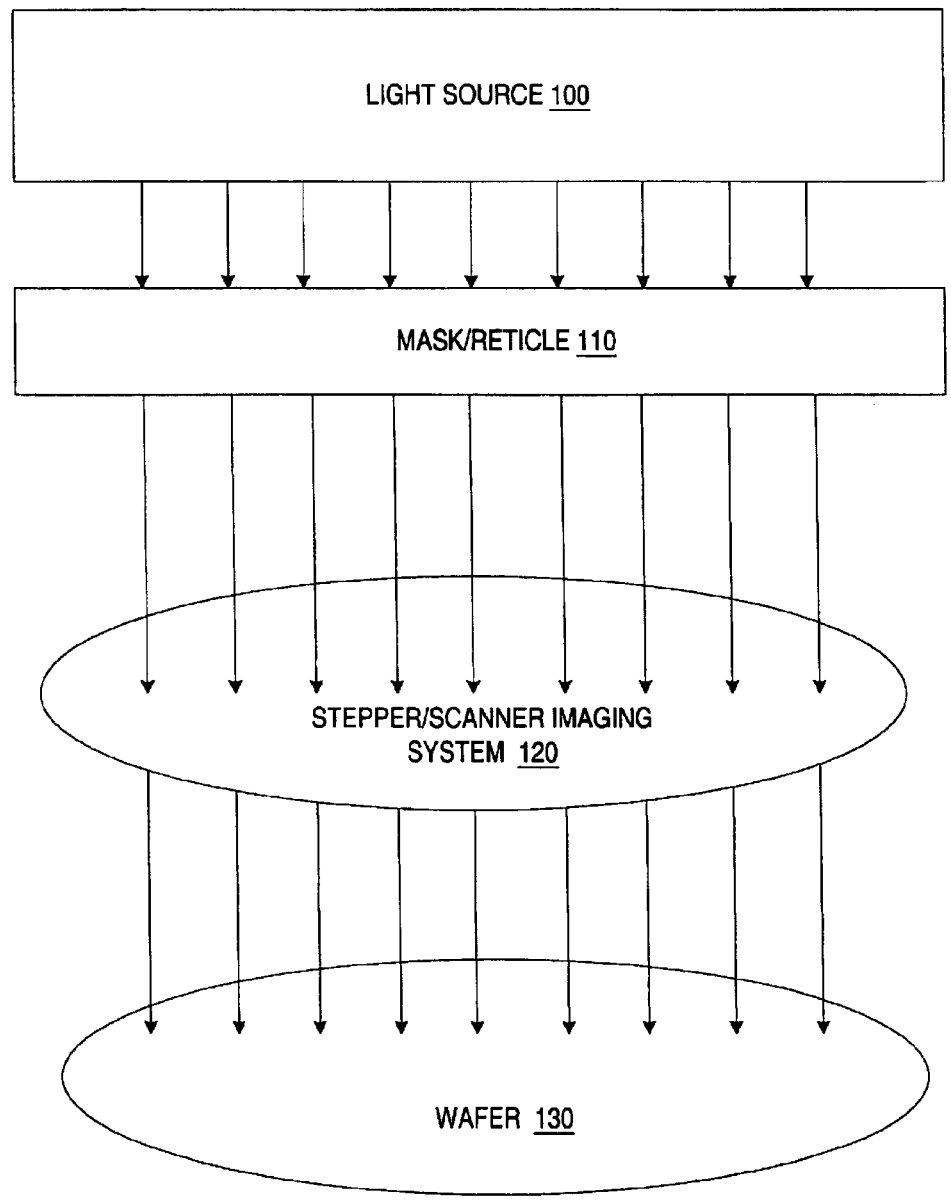
FIG. 1 is a prior art embodiment of an integrated circuit (IC) processing arrangement.

FIG. 1 is one embodiment of an integrated circuit (IC) processing arrangement. The arrangement of FIG. 1 is suitable for use with the invention and can be used as described below. The general uses of the components of FIG. 1 are known in the art. Specifically, light source 100 provides light towards wafer 130. Mask/reticle 110 blocks light for certain predetermined portions of wafer 130. Stepper/scanner imaging system 120 directs the patterns of mask/reticle 110 to one of multiple ICs being developed on wafer 130. The components of FIG. 1 can be modified as described in greater detail below. For example, specific layout definitions can be created for mask/reticle 110 to develop a desired layout of an IC device on wafer 130.

Figure 2:
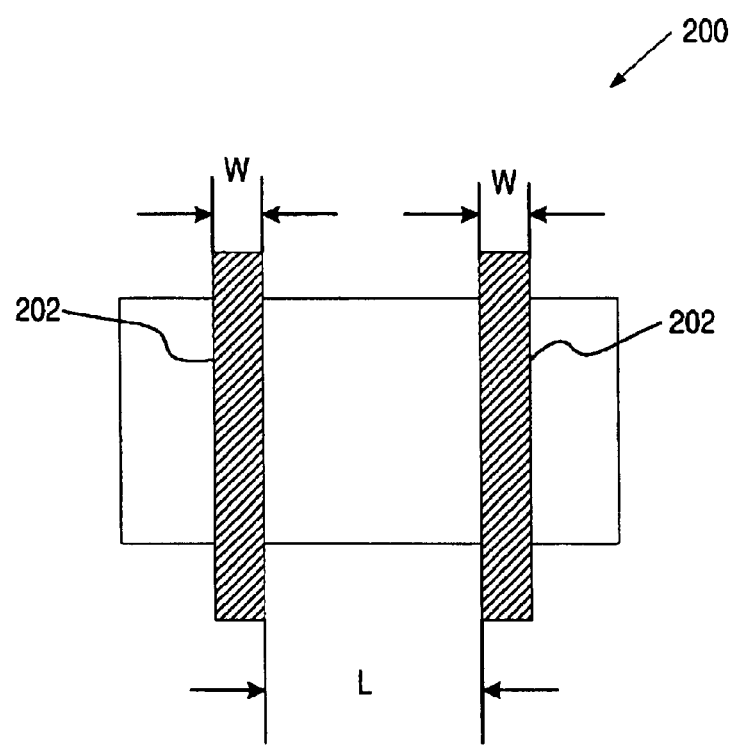
FIG. 2 illustrates a portion of an exemplary design layout of an IC device.

FIG. 2 illustrates a portion of an exemplary design layout of an IC device. The design layout can be, for example, a GDS-II description of the circuit to be manufactured. Other layout formats can also be supported. The design layout describes the circuit design from which masks and/or reticles are created to realize the circuit described by the design layout.

Layout 200 includes two target features 202. In the remaining portions of layout 200, no structures are formed. Depending on distance L between the target features 202 and width W of each target feature 202, target features 202 may be considered to create an isolated pattern, a dense pattern, or a semi-dense pattern. For example, an isolated pattern may be created when L>=6*W; a dense pattern may be created when L=W; and a semi-dense pattern may be created when L is greater than W but less then 6*W. It should be noted that other classification criteria can be used to determine whether the pattern is dense, semi-dense, or isolated. As well known in the art, the contrast and resolution of dense patterns are significantly better than that of isolated patterns.

In one embodiment, each target feature 202 represents a transistor gate. In this embodiment, layout portion 200 is a partial layout of a gate layer that can be manufactured, for example, with polysilicon. A gate is formed by the portion of the polysilicon layer (referred to as a poly layer) that overlies a diffusion layer (referred to as an active layer). In other embodiments, target features 202 may represent parts of other integrated device layers or structures such as metal interconnects or contact layers.

In one embodiment, each target feature 202 has a dimension that is below the minimum dimension which can be formed by a single exposure fabrication process Alternatively, target features 202 may have dimensions that can be formed by a single exposure with the depth of focus lower than desired.

Figure 3:
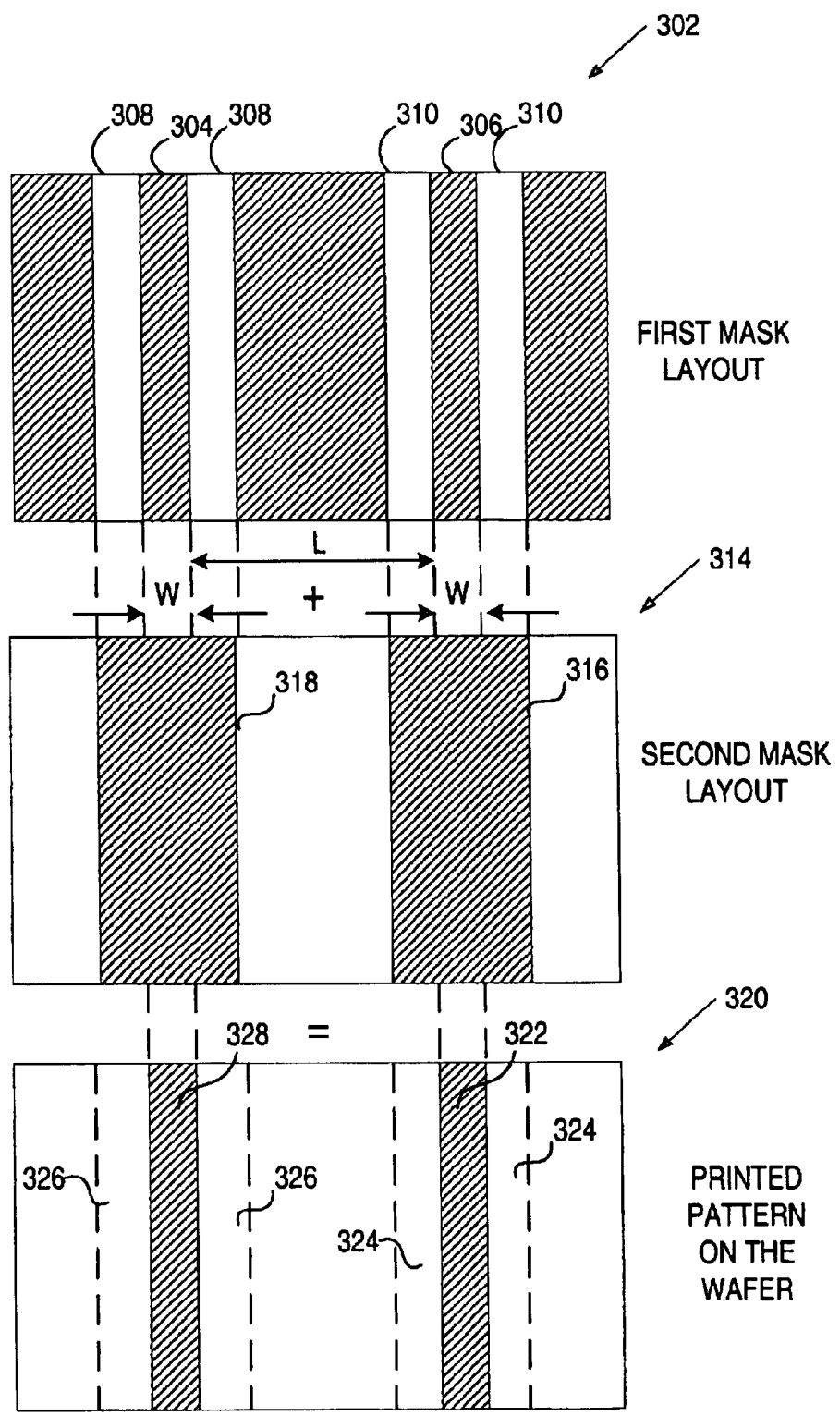
FIG. 3 illustrates layout definitions for masks used in a multiple exposure fabrication process, according to one embodiment of the present invention.

FIG. 3 illustrates layout definitions for masks used in a multiple exposure fabrication process, according to one embodiment of the present invention. In some embodiments, the masks are traditional photomasks known as binary-intensity masks (BIMs) (or simply binary masks) because their regions are either transparent or opaque. Binary masks are typically realized by coating an opaque material such as chrome on a clear-material substrate such as a glass substrate. The opaque material is then removed to make the mask clear in specified regions. As well known in the art, the cost associated with binary masks is significantly lower than that of alternating PSMs. In other embodiments, the masks are masks or reticles other than binary masks (e.g., attenuated PSMs) that are most cost efficient than alternating PSMs. In yet other embodiments, the masks are a combination of binary masks and other cost efficient masks.

While the following description refers to binary masks, the techniques described can also be used with other masks or reticles (e.g., attenuated PSMs) that are more cost efficient than alternating PSMs.

Referring to FIG. 3, layouts 302 and 314 are created based on desired layout 200 of FIG. 2. Layout 302 includes dark features 304 and 306 that correspond to target features 202 of desired layout 200. In one embodiment, layout 302 includes clear regions 308 on each side of feature 304 and clear regions 310 on each side of feature 306. These regions of layout 302 will define structures on a first binary mask used with the first exposure. This mask will be a dark-field mask that includes clear structures (defined by clear areas 308 and 310) surrounded by the opaque content. In one embodiment, in which target features 202 are gates, layout 302 changes the tone of a bright-field mask typically used with a gate layer, resulting in a dark-field mask with clear structures defined by clear areas 308 and 310. Each pair of clear areas 308 and 310 converts the initial isolated pattern having one dark feature into a dense pattern having two clear features. The increased density will enhance the contrast and resolution of the pattern printed on the wafer (pattern 320). The first mask will print trenches 324 and 326 around target features 322 and 328 on the wafer, creating the borders of each target feature.

Layout 314 is a layout for a second binary mask that is used with the second exposure. Layout 314 includes dark features 316 and 318 surrounded by clear areas. Dark features 316 and 318 correspond to features 304 and 306 of layout 302 (e.g., dark features 316 and 318 may overlap features 304 and 306). As described above, in one embodiment, features 304 and 306 are surrounded by clear areas 308 and 310. In this embodiment, dark feature 316 defines an opaque area on the second mask to protect the wafer's region that covers trenches 324 completely or partially and target feature 322. Similarly, dark feature 318 defines another opaque area on the second mask to protect the wafer's region that covers trenches 326 completely or partially and target feature 328. Thus, with the second exposure, the regions defined by dark areas 316 and 318 will be protected and resist in the remaining regions will be eliminated.

In one embodiment (not shown), initial layout 200 of FIG. 2 includes one or more additional features other than target features 202. The additional features have dimensions that can be satisfactorily resolved by a single exposure fabrication process. As such, the additional features are not included in layout 302 but they are included as dark areas in layout 314 for printing on the wafer with the second exposure.

Figure 11:
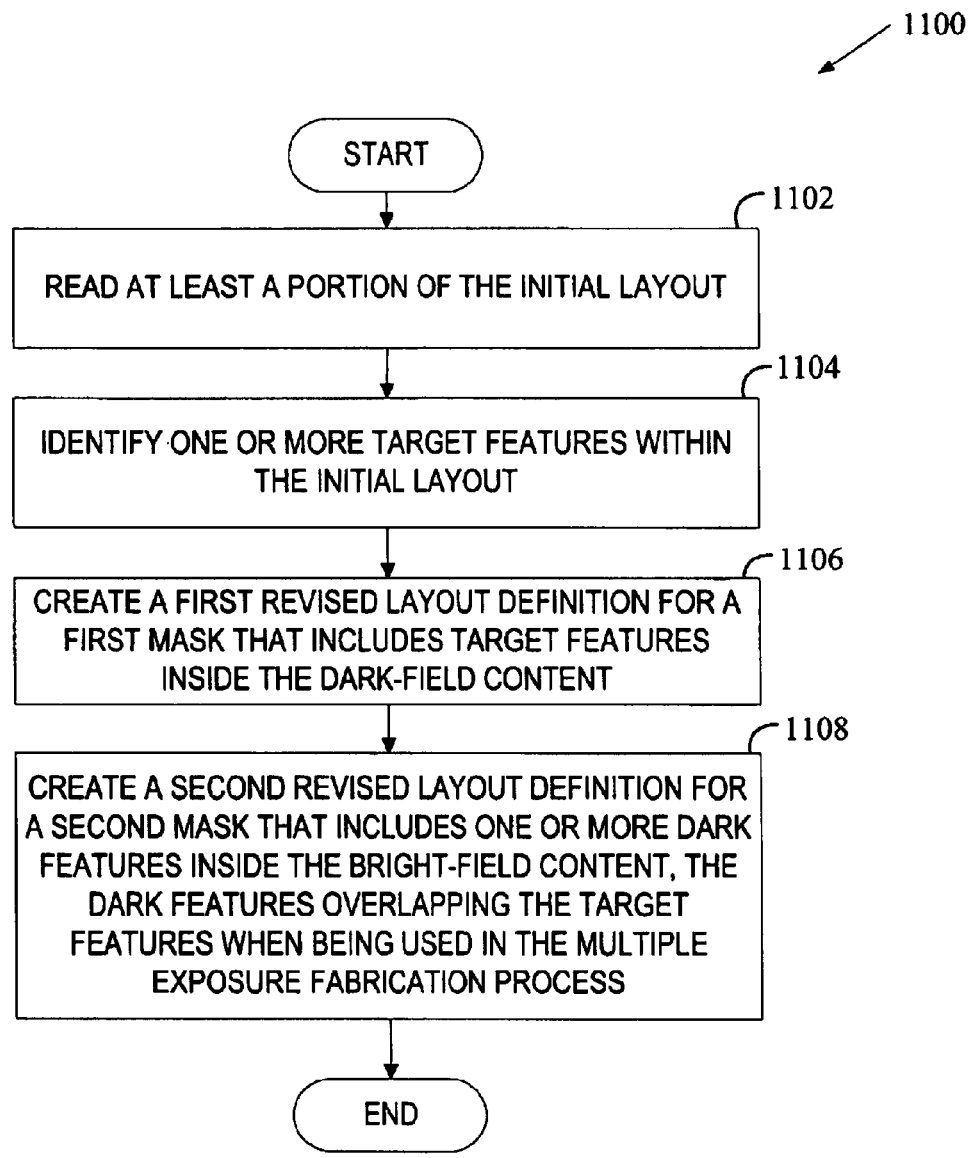
FIG. 11 is a flow diagram of one embodiment of a process for creating a set of layout definitions for use in a multiple exposure fabrication process.

FIG. 11 is a flow diagram of one embodiment of a process 1100 for creating a set of layout definitions for use in a multiple exposure fabrication process. The process 1100 represents a technique referred to herein as a Complementary Double Exposure (CODE) technique. The process may be performed by processing logic that may comprise hardware (e.g., circuitry, dedicated logic, etc.), software (such as run on a general purpose computer system or a dedicated machine), or a combination of both.

Referring to FIG. 11, process 1100 begins with processing logic reading at least a portion of an initial layout of an IC device (processing block 1102). The initial layout may be a layout of a gate layer or any other integrated device layer or structure such as a metal interconnect or a contact layer. At processing block 1104, processing logic identifies one or more target features within the portion of the initial layout. In one embodiment, the target features are classified as isolated features. In another embodiment, the target features are classified as dense features. In yet another embodiment, the target features are classified as semi-dense features. The classification is based on various parameters including the distance between the target features, dimensions of the target features, etc. In one embodiment, the classification criteria are predetermined. Alternatively, the classification criteria are specified by the user.

At processing block 1106, processing logic creates a first revised layout definition. The first layout definition is created for a first mask used in the multiple exposure fabrication process. In one embodiment, the first mask is a binary mask. Alternatively, the first mask may be an attenuated PSM. The layout definition for the first mask includes the target features inside the dark-field content. In one embodiment, the layout definition also includes clear areas around the target features. The number of clear areas may vary depending on density of the target pattern, as will be described in greater detail below. With the first exposure, the clear areas will form trenches on the wafer, thus creating one or two borders of each target feature.

At processing block 1108, processing logic creates a second revised layout definition. The second layout definition is created for a second mask used in the multiple exposure fabrication process. In one embodiment, the second mask is a binary mask. Alternatively, the second mask may be an attenuated PSM. The layout definition for the second mask includes one or more dark features inside the bright-field content. These dark features, when used in the multiple exposure fabrication process, will overlap the target features to protect the target features during the second exposure. Accordingly, with the second exposure, the pattern printed on the wafer with the first mask is protected, and resist from the remaining regions is eliminated. In one embodiment, the dark features also overlap the trenches created during the first exposure.

In one embodiment, the initial layout contains additional features that were not included in the first layout definition. The additional features have dimensions that can be satisfactorily resolved by a single exposure fabrication process. These additional features are included in the second layout definition to be printed with the second exposure.

Figures 4A, 4B:
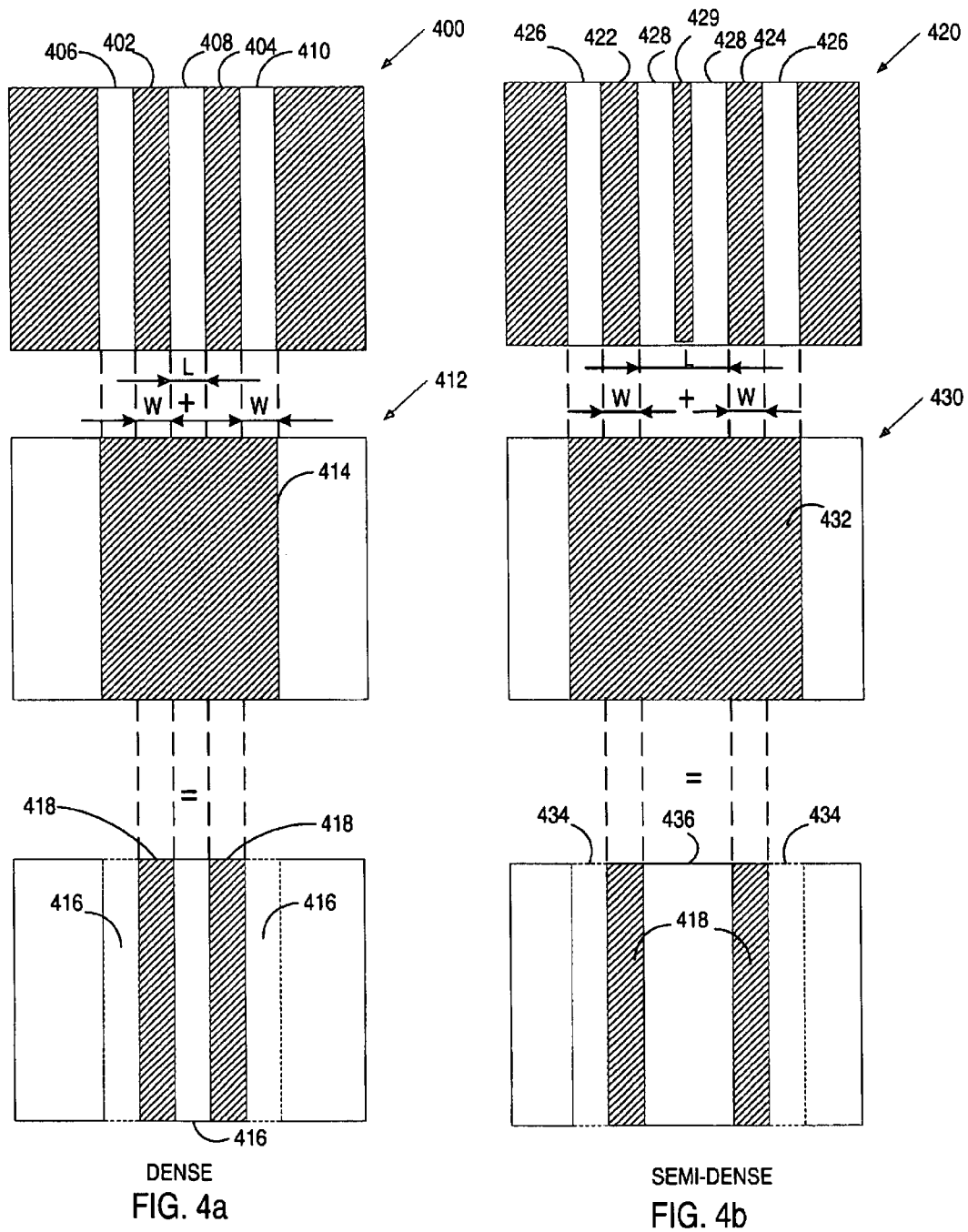
FIGS. 4A–4C illustrate layout definitions used in a multiple exposure fabrication process for target patterns of various density, according to one embodiment of the present invention.
Figure 4C:
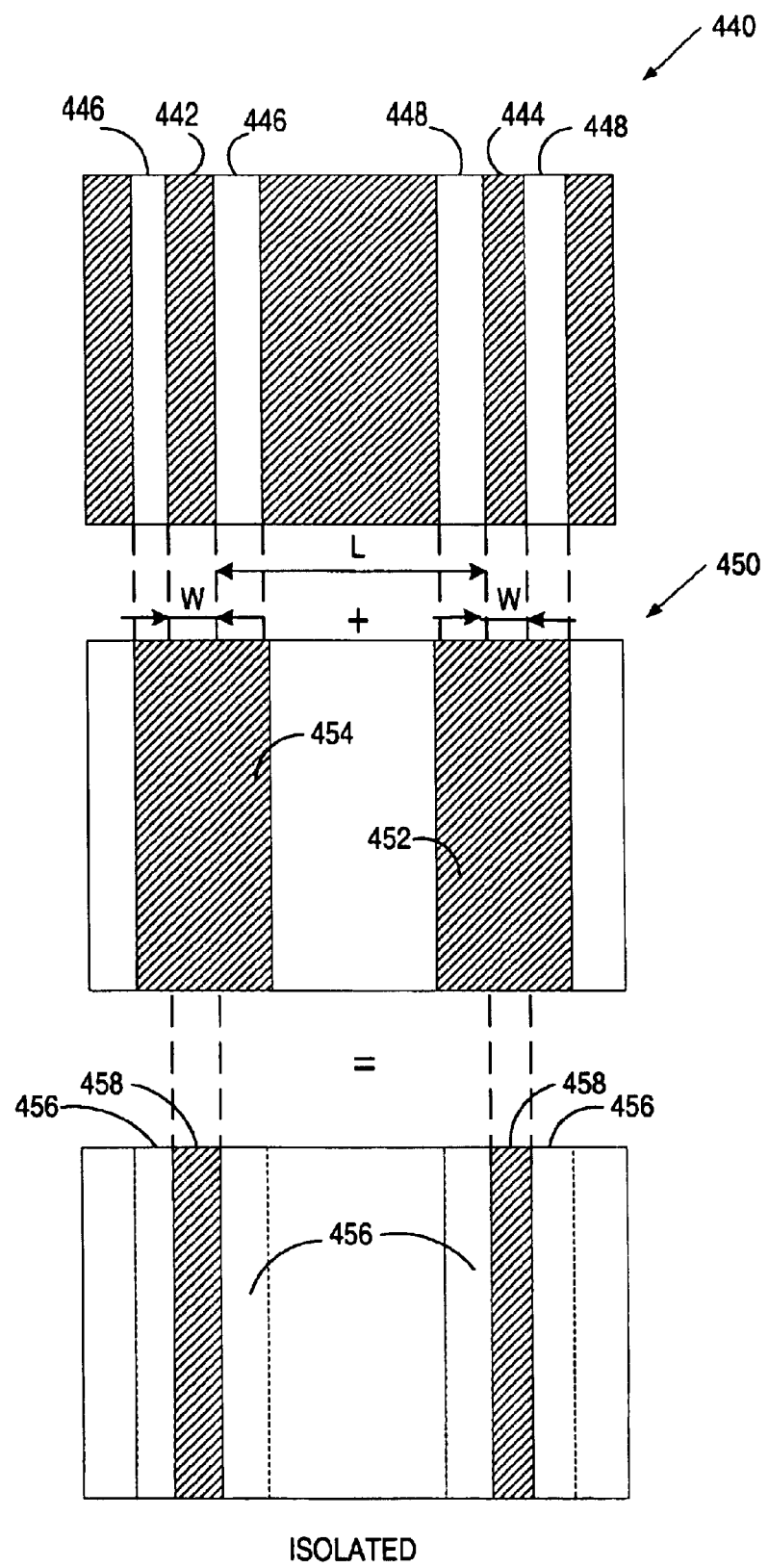

FIGS. 4A–4C illustrate layout definitions used in a multiple exposure fabrication process for target patterns of various density, according to one embodiment of the present invention. As described above, depending on the width of target features and the distance between the target features, the target pattern can be classified as dense, semi-dense, or isolated. The criteria for this classification can be specified by the user depending on feature dimensions, imaging system being used, and other factors. Alternatively, these criteria may be programmatically defined. For example, the target pattern may be classified as dense if width W of target features is equal to distance L between the target features. The target pattern may be classified as isolated if L>=6×W. and as semi-dense if L is greater than W but less then 6×W.

Referring to FIG. 4A, layouts 400 and 412 can be used for dense target patterns. Layout 400 includes dark features 402 and 404, clear area 406 on the left side of feature 402, clear area 410 on the right side of feature 404, and clear area 408 between features 402 and 404. The remaining areas of layout 400 are dark. Layout 400 is a layout for a mask that will be used with the first exposure. This mask will be a dark-field mask with three clear areas (defined by areas 406, 408, 410) that will cause printing of three trenches 416 on the wafer, thus creating the borders of each target feature 418. The distance between features 402 and 404 is small enough to provide sufficient periodicity for maximum resolution.

Layout 412 includes dark feature 414 surrounded by clear areas. Layout 412 defines a second mask (a bright-field mask) for use with the second exposure that will protect the exposed regions (trenches 416 and target features 418) on the wafer and eliminate resist in the remaining regions.

Referring to FIG. 4B, layouts 420 and 430 for a semi-dense target pattern is illustrated. Layouts 420 and 430 are similar to layouts 400 and 412 of FIG. 4A. However, because of a larger distance L, clear area 428 between dark features 422 and 424 will define a larger aperture between the lines on the mask. Because of this larger aperture, the lines on the mask may not be close enough to provide the sufficient contrast and resolution of the corresponding lines printed on the wafer. In one embodiment, to improve lithographic performance, one or more dark regions 429 are added inside clear area 428 of layout 420 to define additional features (known as assist features) on the first mask. In one embodiment, the width of the dark region 429 is small enough as not to be printed on the wafer. In another embodiment (not shown in FIG. 4B), the dark region 429 is printable on the wafer. Exemplary embodiments of the CODE technique used for various semi-dense patterns will be described in more detail below in conjunction with FIGS. 5A–5C.

Referring to FIG. 4C, layouts 440 and 450 can be used for isolated target patterns. With an isolated target pattern, distance L between the target features is large enough to contain a clear area on each of side of the target feature, thus converting the isolated pattern defined by each target feature into a dense pattern. Accordingly, similarly to layouts of FIG. 3, layout 440 includes dark feature 442 with clear area 446 on each side of dark feature 442, dark feature 444 with clear area 448 on each side of dark feature 444, and the surrounding dark content. Each pair of clear areas 446 and 448 provides the necessary pattern periodicity on the first mask to enhance the contrast and resolution of the printed features 458 on the wafer. The first mask will print trenches 456 around target features 458, creating the borders of each target feature 458.

Layout 450 of the second mask includes dark features 452 and 454 that will protect each wafer region that covers trenches 456 and target feature 458.

Figure 5A:
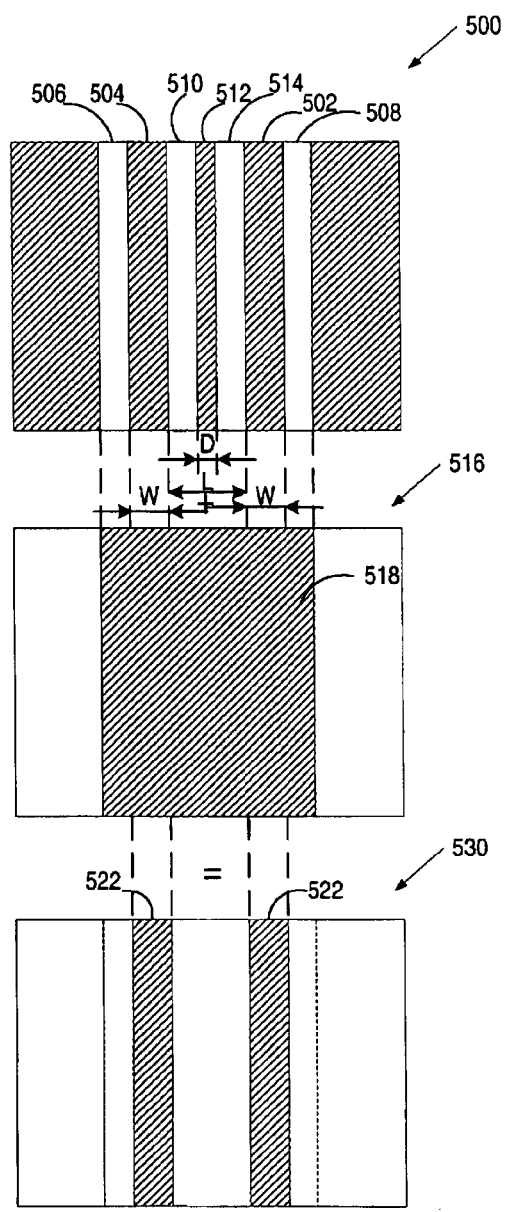
FIGS. 5A–5C illustrate layout definitions used in a multiple exposure fabrication process for semi-dense target patterns, according to one embodiment of the present invention.
Figure 5B:
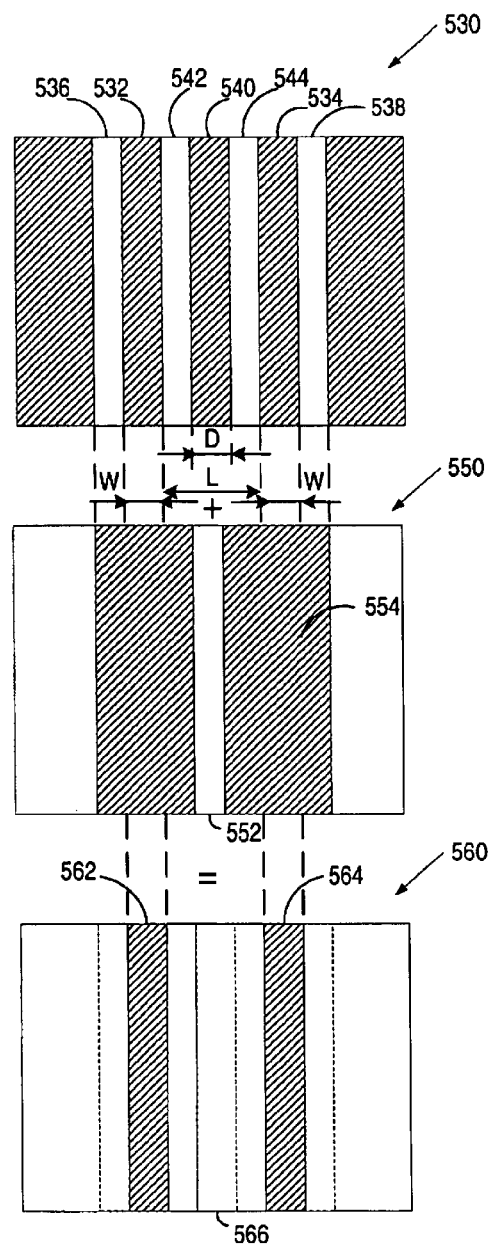
Figure 5C:
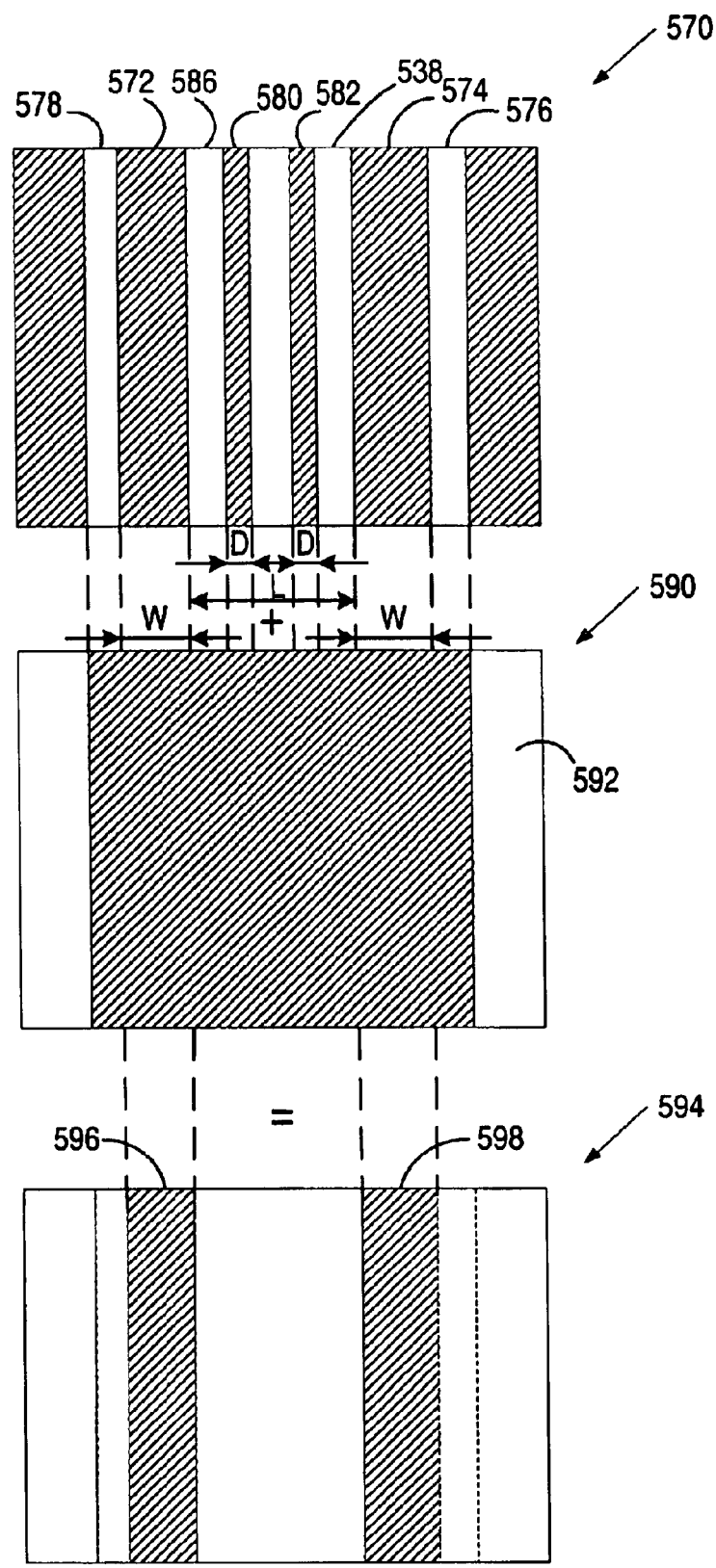

FIGS. 5A–5C illustrate layout definitions used in a multiple exposure fabrication process for semi-dense target patterns, according to one embodiment of the present invention. Each of FIGS. 5A–5C shows a layout for a first mask, a layout for a second mask, and a printed pattern on the wafer.

In one embodiment, mask layouts for semi-dense target patterns define one or more assist features between the structures on the mask. An assist feature is a small additional feature placed on the mask near an isolated or semi-dense line. It is well known in the art that assist features can improve pattern fidelity. The use of assist features is especially advantageous when combined with off-axis illumination (e.g., dipole illumination, quadrupole illumination, and annular illumination).

In one embodiment, the size of assist features and their number depend on the distance between the target features.

In one embodiment, the size and number of assist features is defined for each distance range based on such factors as desired dimensions of target features, imaging systems being used, etc. Various distance ranges and corresponding sizes and numbers of assist features may be predetermined or specified by the user. In one embodiment, the user may be provided with an option to select a smaller number of larger assist features or a larger number of narrower assist features.

Referring to FIG. 5A, an example is illustrated in which distance L between target features 502 and 504 requires a narrow assist feature on the first mask. The assist feature is narrow enough (e.g., a 50 nm wide at design scale) as not to be reflected on the wafer with the first exposure. Accordingly, layout 500 includes a narrow dark area 512 between target features 502 and 504 to define an assist feature on the first mask. The first mask will then create trenches on the wafer that will define the borders of the target features 522. Layout 516 of the second mask includes a dark feature 518 to protect the exposed part and eliminate the remaining resist.

Referring to FIG. 5B, an example is illustrated in which distance L between target features 532 and 534 is larger than that shown in FIG. 5A. In one embodiment, distance L falls within the distance range requiring a wider assist feature (e.g., a 100 nm wide or 150 nm wide at design scale) in the first mask. Accordingly, layout 530 includes a wider dark region 540 between target features 532 and 534 to define a wider assist feature on the first mask. This wider assist feature may create an extra region 566 (referred to as a scatter bar) on the wafer. In one embodiment, layout 550 for the second mask includes a clear region 552 that corresponds to dark region 540 of layout 530. Clear region 552 will define an opening in the second mask that causes removal of the scatter bar 566 from the wafer with the second exposure. In one embodiment, clear region 552 has the same width as the scatter bar 566. Alternatively, clear region 552 may be larger than the scatter bar 566.

Referring to FIG. 5C, an example is illustrated in which distance L between target features 572 and 574 falls within the distance range requiring two assist features in the first mask. Accordingly, layout 570 includes two dark regions 580 and 582 between target features 572 and 574 to define two assist features in the first mask. Each assist feature is narrow enough (e.g., a 50 nm wide at design scale) to avoid forming a scatter bar on the wafer.

It should be noted that the CODE technique can use any number of dark regions within the layout of the first mask to define a corresponding number of assist features in the first mask. Those dark regions can be non printable or printable depending on the distance between the original target features as illustrated before.

FIGS. 6A–6D illustrate a process of creating mask layouts for use in a double exposure fabrication process of an exemplary gate layer, according to one embodiment of the present invention.

Figure 6A:
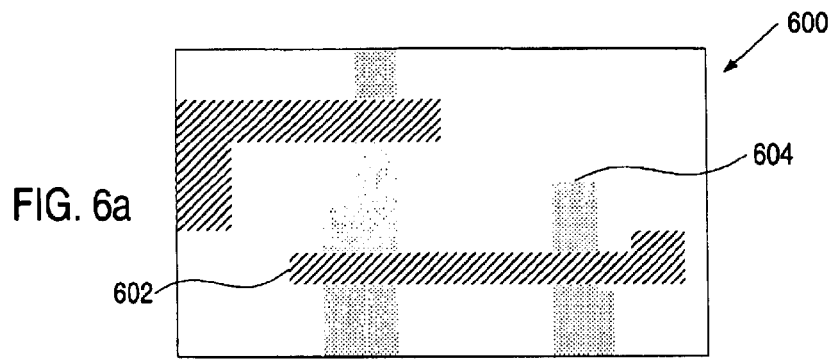
FIGS. 6A–6D illustrate a process of creating mask layouts for use in a double exposure fabrication process of an exemplary gate layer, according to one embodiment of the present invention.

Referring to FIG. 6A, a gate layer layout 600 is shown. Layout 600 includes polysilicon (referred to as poly) regions 602. Portions of poly regions 602 form transistor gate regions over diffusion (referred to as active) regions 604.

Figure 6B:
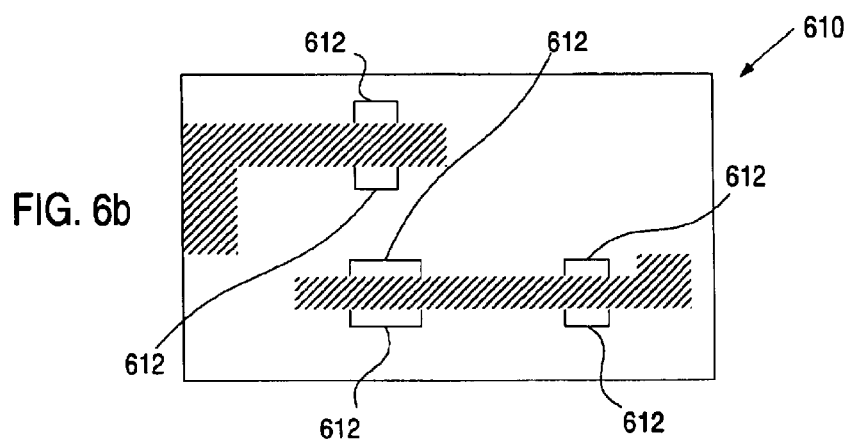

Referring to FIG. 6B, a clear area 612 is created on both sides of the gate region. The length of each clear area 612 is defined by the length of the gate. In one embodiment, the length of each clear area 612 is larger than that of the gate by an extension specified by the user or pre-determined based on rules. The width of each clear area 612 may be predetermined or specified by the user.

Figure 6C:
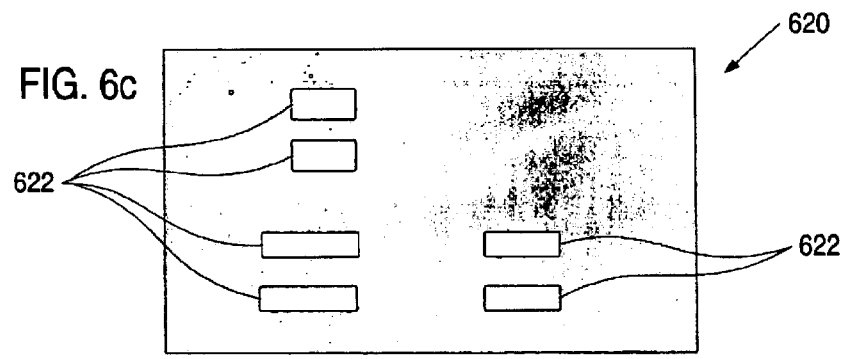

Referring to FIG. 6C, a layout 620 of a first binary mask is illustrated. Layout 620 with clear areas 622 inside the dark content defines a dark-field mask that prints trenches on the wafer, thus creating target dimensions of the gates.

Figure 6D:
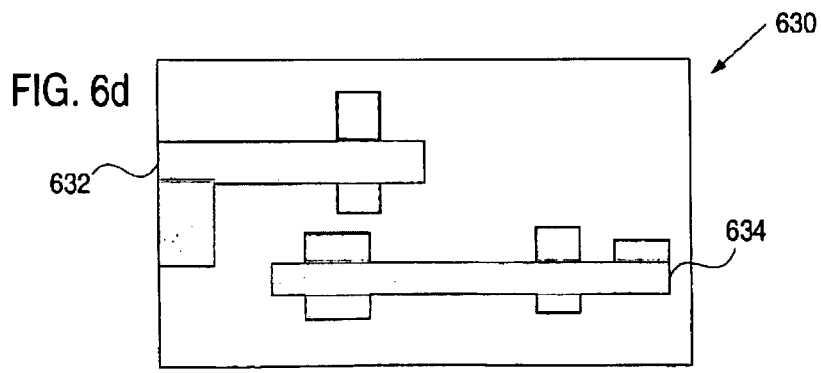

Referring to FIG. 6D, a layout 630 of a second binary mask is illustrated. Layout 630 includes dark polygons 632 and 634 to protect trenches and gate regions and to print features from gate layer layout 600 that were not included in layout 620 of the first mask.

Figure 7A:
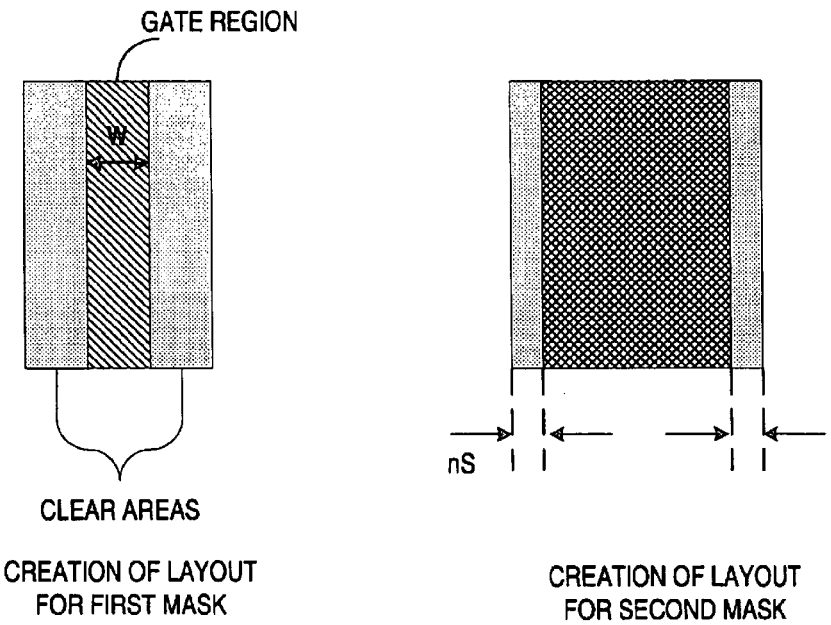

FIGS. 7A–7E illustrate exemplary mask layouts used for one-dimensional gate level structures, according to one embodiment of the present invention. FIG. 7A shows that the width of the dark region in the second layout is smaller by a certain parameter nS (e.g., by 20 nm) than the total width of the gate region and the surrounding clear areas from the first layout. In an alternative embodiment (not shown), the width of the dark region in the second parameter may be larger by a certain parameter than the total width of the gate region and the surrounding clear areas from the first layout.

Figure 7B:
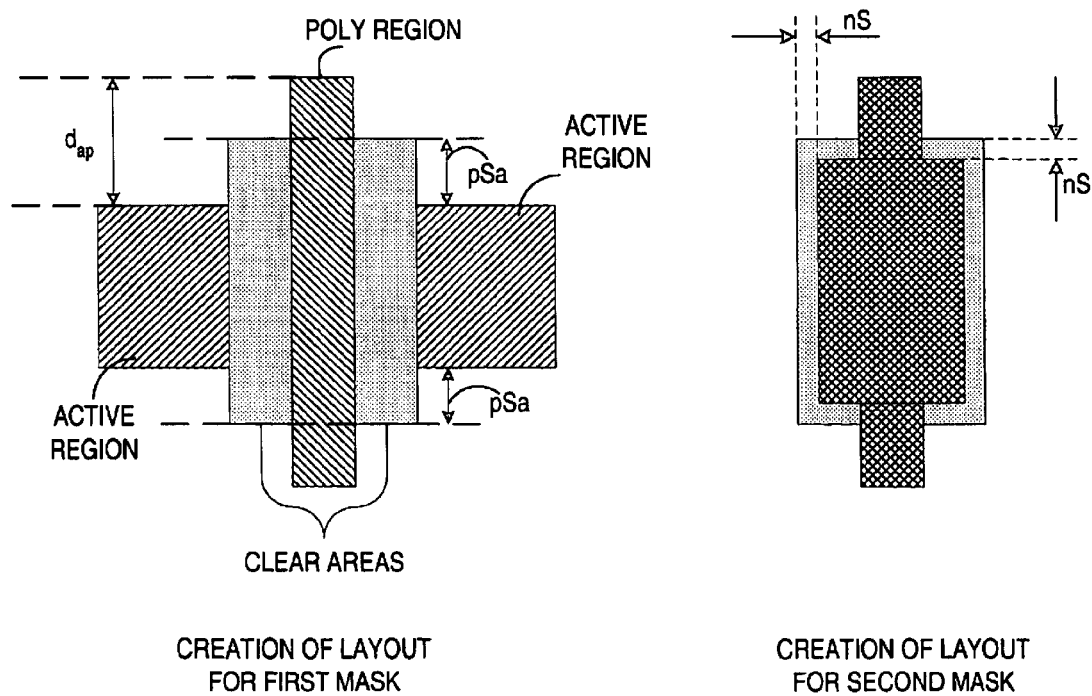
Figure 7C:
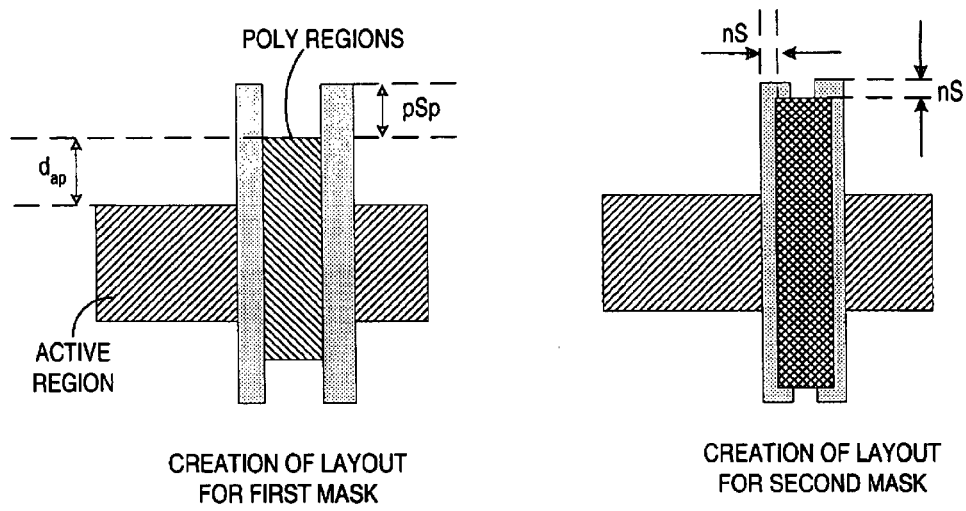

FIGS. 7B and 7C illustrate the creation of clear areas around the gate region, according to one embodiment of the present invention. For example, when distance $d_{ap}$ between the active region and the poly region exceeds a certain threshold (e.g., 0.16 μm) as shown in FIG. 7B, the length of the clear area may be extended by a parameter pSa (e.g., 60 nm) beyond the active region. The dark area in the second layout may be created using a negative sizing nS. In an alternative embodiment (not shown), the dark area in the second layout may be created using a positive sizing nS.

When distance $d_{ap}$ between the active region and the poly region is below a certain threshold (e.g., 0.16 μm or less) as shown in FIG. 7C, the length of the clear area may be extended by a parameter pSp (e.g., 50 nm) beyond the poly region to print the poly region correctly. The dark area in the second layout may be created using a negative sizing nS. In an alternative embodiment (not shown), the dark area in the second layout may be created using a positive sizing nS.

Figure 7D:
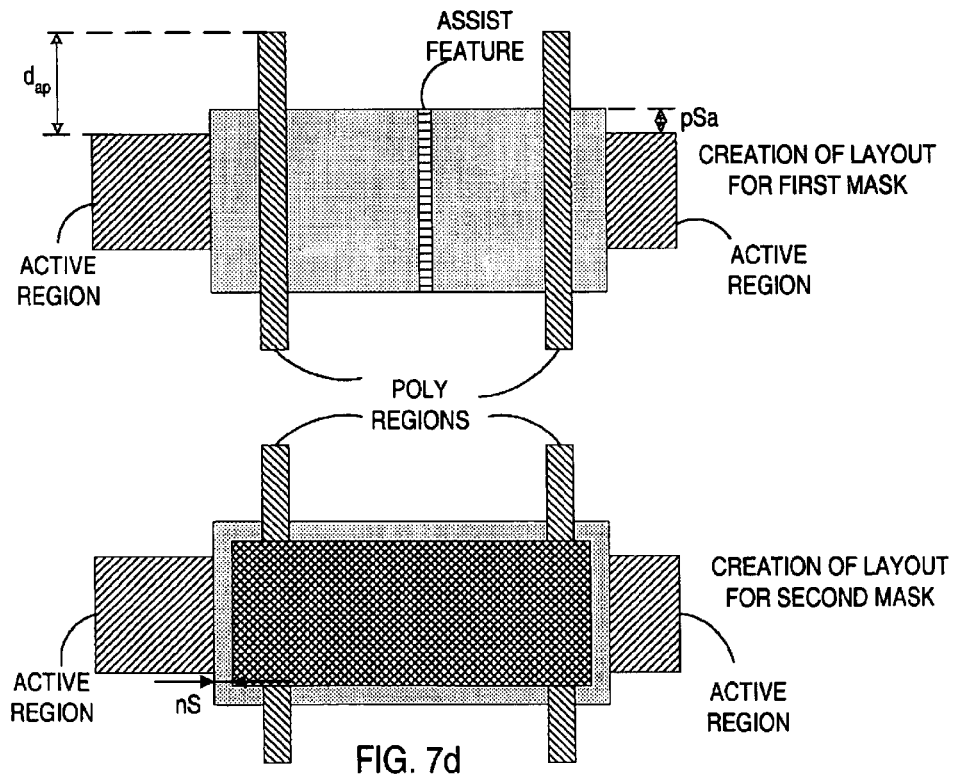
Figure 7E:
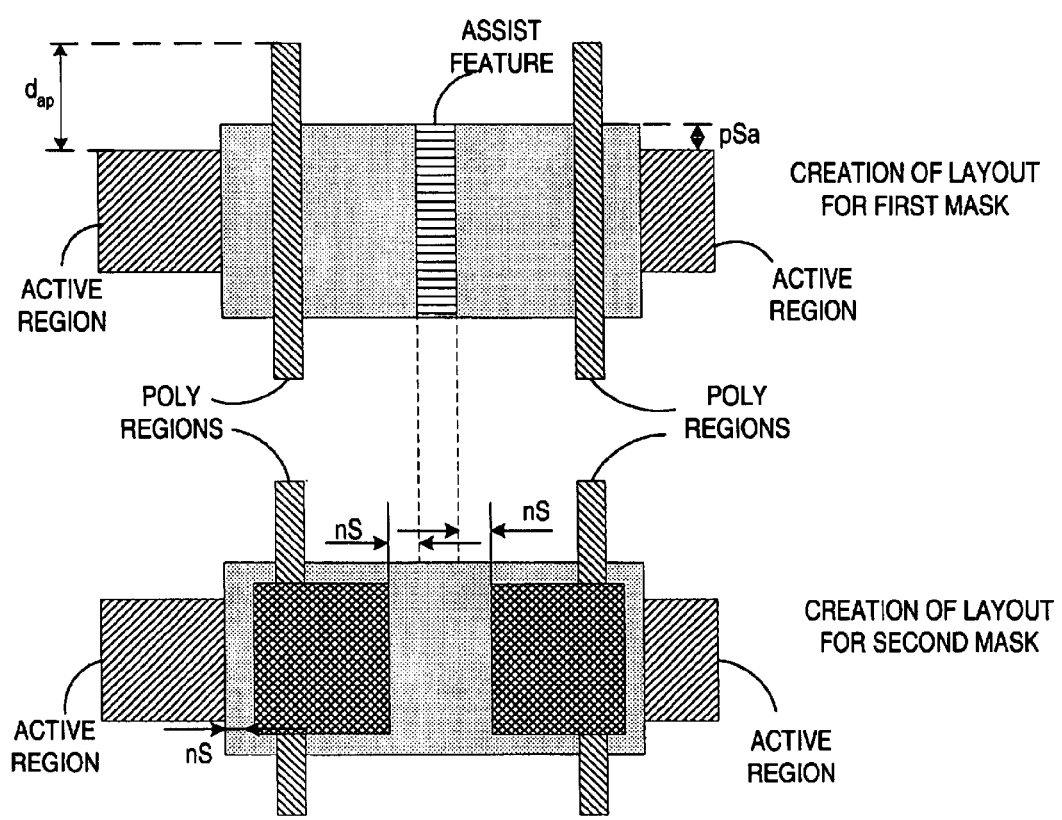

FIGS. 7D–7G illustrate the creation of layouts for masks with assist features, according to one embodiment of the present invention. FIGS. 7D and 7E illustrate the creation of layouts for the first and second masks when distance $d_{ap}$ between the active region and the poly region exceeds a certain threshold (e.g., 0.16 μm). In FIG. 7D, the assist feature is narrow enough as not to be printable on the wafer. In FIG. 7E, the assist feature is printable on the wafer. Accordingly, the layout for the second mask includes a clear area to cause removal of the resulting scatter bar from the wafer. The clear area in the second mask may be extend beyond the assist feature by a parameter nS on each side.

As shown in FIGS. 7D and 7E, the length of the clear areas that create trenches on the wafer limits the length of the assist feature. The length of the clear areas may be extended by a parameter pSa (e.g., 60 nm) beyond the active region, and the dark area in the second layout may be created using a negative sizing nS. In an alternative embodiment (not shown), the dark area in the second layout may be created using a positive sizing nS.

Figure 7G:
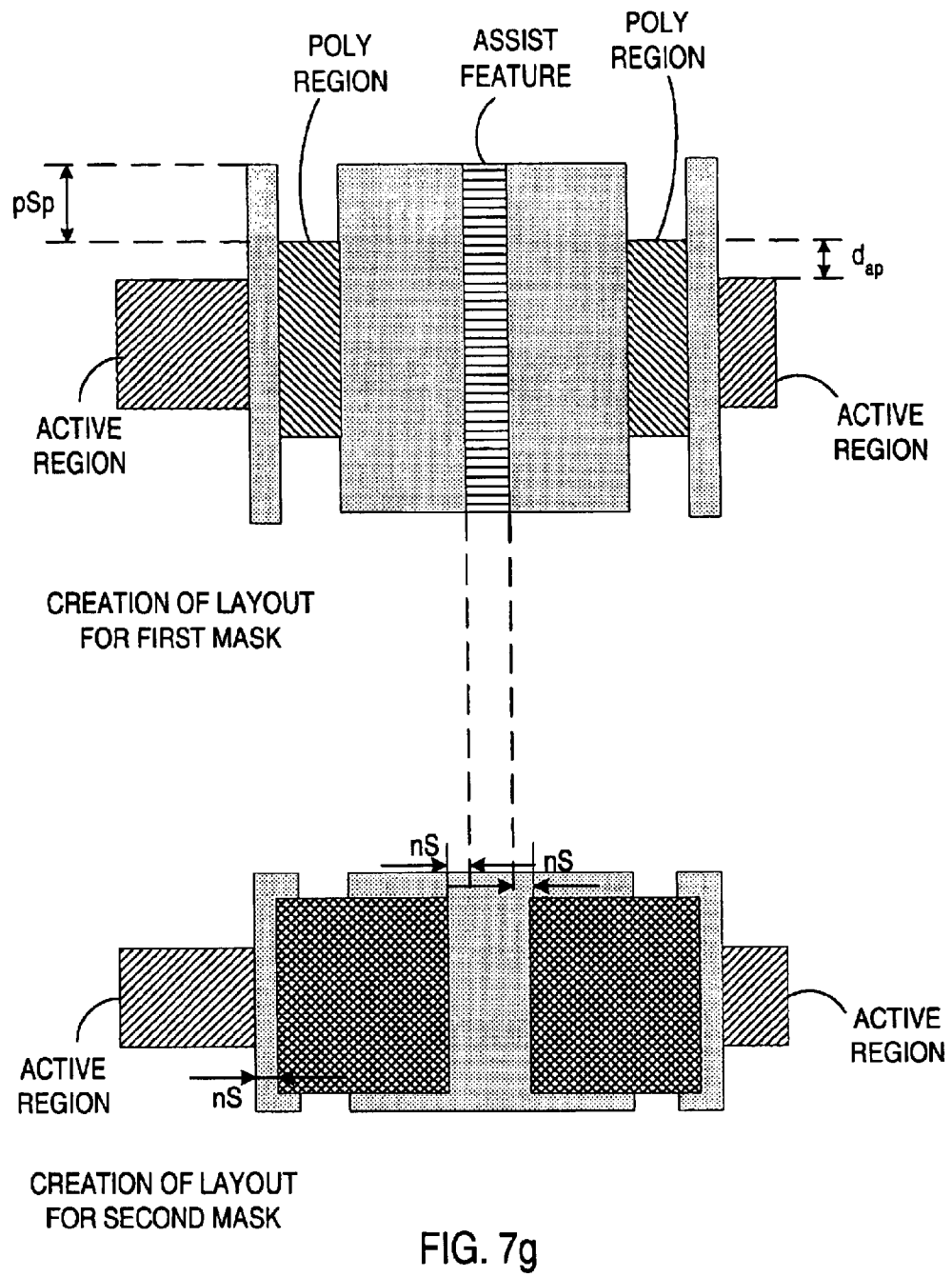

FIGS. 7F and 7G illustrate the creation of layouts for the first and second masks when distance $d_{ap}$ between the active region and the poly region is below a certain threshold (e.g., 0.16 μm). In FIG. 7F, the assist feature is narrow enough as not to be printable on the wafer. In FIG. 7G, the assist feature is printable on the wafer. Accordingly, the second mask includes a clear area (extended beyond the assist feature by a parameter nS on each side) to remove the resulting scatter bar from the wafer.

As shown in FIGS. 7F and 7G, the length of the clear areas may be extended by a parameter pSp (e.g., 60 nm) beyond the poly region, and the dark area in the second layout may be created using a negative sizing nS. In an alternative embodiment (not shown), the dark area in the second layout may be created using a positive sizing nS.

FIGS. 8A–10C illustrate exemplary mask layouts used for two-dimensional gate level structures, according to one embodiment of the present invention. As described above, clear areas that create trenches on the wafer may need to be extended by the parameter pSp (e.g., 50 nm) beyond the poly region to print the top and bottom lines of the poly region correctly. The extension of the clear areas may present problems when mask layouts are created for two-dimensional gate level structures having dense and semi-dense patterns. Exemplary configurations that may present such problems will now be described.

FIGS. 8A–8C illustrate an exemplary configuration of two-dimensional gate level structures including two perpendicular critical poly regions 802 and 804. A critical poly region is a poly region defined by a lithographic performance using a single exposure. Referring to FIG. 8A, the extension of the clear areas may present a problem if the distance between the two perpendicular poly regions is not large enough to allow for a minimum distance $d_{tt}$ required between the perpendicular trenches created on the mask.

Referring to FIG. 8B, an adjusted layout of the first mask includes clear areas 806 around the poly region 802 and clear areas 808 and 810 around the poly region 804. The clear areas 806 extend beyond the top line of the poly region 802 by distance pSp but do not reach the bottom line of the poly region 802 by a distance that allows for distance $d_{tt}$ between the clear areas 806 and the clear area 808. The middle portion 812 of the clear area 808 that is not limited by the clear areas 806 is adjusted to reach the bottom line of the poly region 802. The extended middle portion 812 will print the bottom line of the poly region 802 on the wafer.

Referring to FIG. 8C, a layout of the second mask includes dark areas that cover the poly regions 802 and 804 and corresponding clear areas 806, 808, 810 and 812. The second mask protects the areas resulting from the exposure of the first mask.

Figure 9C:
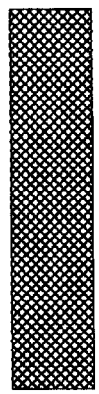
Figure 9B:
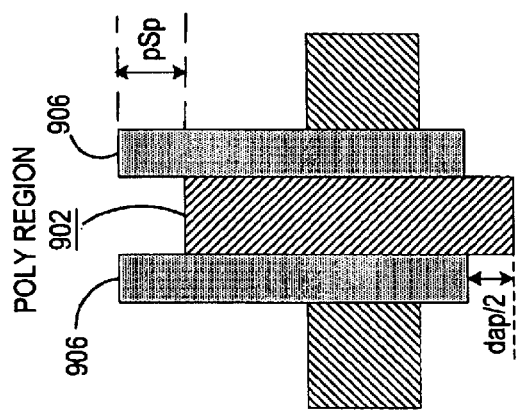
Figure 9A:
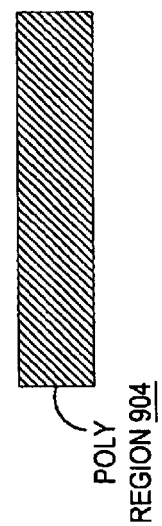

FIGS. 9A–9C illustrate an exemplary configuration of two-dimensional gate level structures including a critical poly region 902 perpendicular to a non-critical poly region 904.

Referring to FIG. 9A, the distance between the two perpendicular poly regions 902 and 904 may not be large enough to allow for an extension of clear areas surrounding the critical poly region 902 beyond the bottom line of the poly region 902.

Referring to FIG. 9B, an adjusted layout of the first mask includes clear areas 906 around the poly region 902 that extend beyond the top line of the poly region 902 by distance pSp but do not reach the bottom line of the poly region 902 by distance $d_{ap}/2$ (i.e., one half of a distance between the poly region 902 and a corresponding active region). Accordingly, the first mask will print the borders of the poly region 902 on the wafer, except the bottom line of the poly region 902.

Referring to FIG. 9C, a layout of the second mask includes dark areas that cover the poly region 902, clear areas 906 and non-critical poly region 904. Accordingly, the second mask protects areas printed by the first mask and prints the bottom line of the poly region 902 and the non-critical poly region 904.

FIGS. 10A–10C illustrate an exemplary configuration of two-dimensional gate level structures including two opposite critical poly regions 1002 and 1004.

Referring to FIG. 10A, the distance between the two opposite poly regions 1002 and 1004 may not be large enough for extending clear areas surrounding the poly region 1002 beyond the bottom line of the poly region 1002 and for extending clear areas surrounding the poly region 1004 beyond the top line of the poly region 1004.

Referring to FIG. 10B, an adjusted layout of the first mask includes clear areas 1006 around the poly region 1002 that extend beyond the top line of the poly region 1002 by distance pSp but do not reach the bottom line of the poly region 1002 by distance $d_{ap}/2$ (i.e., one half of a distance between the poly region 1002 and a corresponding active region). Similarly, clear areas 1008 around the poly region 1004 extend beyond the bottom line of the poly region 1004 by distance pSp but do not reach the top line of the poly region 1004 by distance $d_{ap}/2$. Accordingly, the first mask will print the borders of the poly regions 1002 and 1004 on the wafer, except the bottom line of the poly region 1002 and the top line of the poly region 1004.

Referring to FIG. 10C, a layout of the second mask includes dark areas that cover the poly regions 1002 and 1004 and corresponding clear areas 1006 and 1008. Accordingly, the second mask protects areas printed by the first mask and prints the bottom line of the poly region 1002 and the top line of the poly region 1004.

It should be noted that various solutions other than those described above can be used to address problems with one-dimensional and two-dimensional gate structures without loss of generality.

Figure 12:
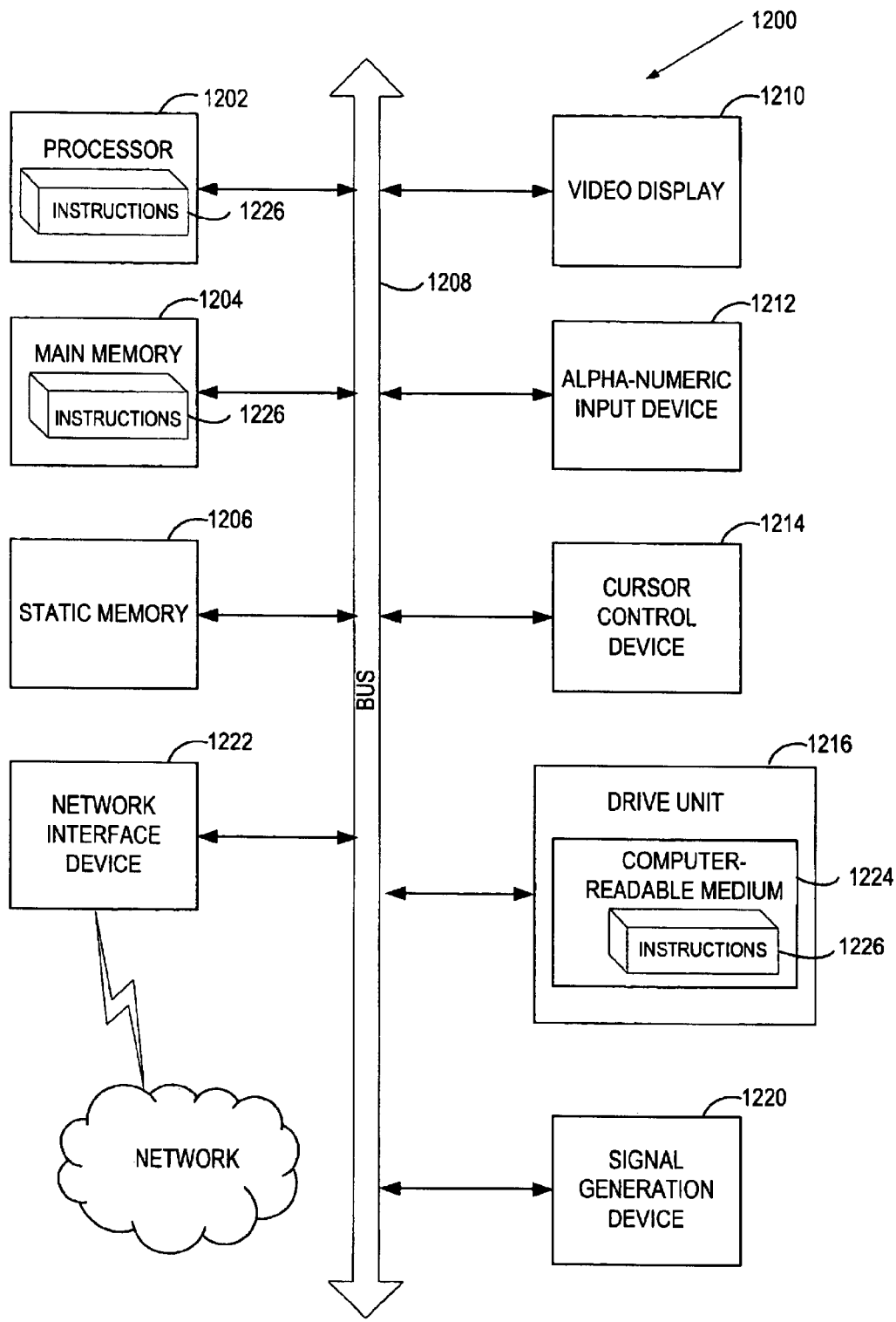
FIG. 12 is a block diagram of an exemplary computer system.

FIG. 12 is a block diagram of an exemplary computer system 1200 that may be used to perform one or more of the operations described herein. In alternative embodiments, the machine may comprise a network router, a network switch, a network bridge, Personal Digital Assistant (PDA), a cellular telephone, a web appliance or any machine capable of executing a sequence of instructions that specify actions to be taken by that machine.

The computer system 1200 includes a processor 1202, a main memory 1204 and a static memory 1206, which communicate with each other via a bus 1208. The computer system 1200 may further include a video display unit 1210 (e.g., a liquid crystal display (LCD) or a cathode ray tube (CRT)). The computer system 1200 also includes an alphanumeric input device 1212 (e.g., a keyboard), a cursor control device 1214 (e.g., a mouse), a disk drive unit 1216, a signal generation device 1220 (e.g., a speaker) and a network interface device 1222.

The disk drive unit 1216 includes a computer-readable medium 1224 on which is stored a set of instructions (i.e., software) 1226 embodying any one, or all, of the methodologies described above. The software 1226 is also shown to reside, completely or at least partially, within the main memory 1204 and/or within the processor 1202. The software 1226 may further be transmitted or received via the network interface device 1222. For the purposes of this specification, the term "computer-readable medium" shall be taken to include any medium that is capable of storing or encoding a sequence of instructions for execution by the computer and that cause the computer to perform any one of the methodologies of the present invention. The term "computer-readable medium" shall accordingly be taken to included, but not be limited to, solid-state memories, optical and magnetic disks, and carrier wave signals.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method for separating an initial layout of an integrated circuit device into a set of layout definitions for use in a multiple exposure fabrication process, the method comprising:

reading at least a portion of the initial layout;

identifying one or more target features within the initial layout;

creating a first revised layout definition for a first mask, the first revised layout definition including the one or more target features and adjacent clear areas inside dark-field content; and creating a second revised layout definition for a second mask, the second revised layout definition including one or more dark features inside bright-field content, wherein the one or more dark features, when used in the multiple exposure fabrication process, will overlap the one or more target features.

2. The method of claim 1 wherein each of the first mask and the second mask is any one of a binary mask and an attenuated phase-shifting mask.

3. The method of claim 1 wherein the second revised layout definition further includes features from the initial layout that are not present in the first revised layout definition inside the bright-field content.

4. The method of claim 1 wherein each of the one or more dark features of the second revised layout definition covers each of the one or more target features of the first revised layout definition and the corresponding adjacent clear areas.

5. The method of claim 4 wherein the one or more target features represent two target features positioned at a distance from each other.

6. The method of claim 5 wherein the distance is below a first limit associated with an isolated pattern.

7. The method of claim 6 wherein the dark feature of the second revised layout definition covers an area beginning with a leftmost clear area adjacent to a first target feature of the two target features and ending with the rightmost clear area adjacent to a second target feature of the two target features.

8. The method of claim 6 wherein the distance is between the first limit associated with the isolated pattern and a second limit associated with a dense pattern.

9. The method of claim 8 further comprising:

adding one or more assist features between the two target features in the first revised layout definition.

10. The method of claim 9 further comprising:

adding a clear area corresponding to any of the one or more assist features within the dark feature of the second revised layout definition when the width of the any of the one or more assist features exceeds a predefined threshold.

11. The method of claim 1 wherein each of the one or more target features corresponds to a gate of a transistor.

12. The method of claim 11 wherein creating the adjacent clear areas comprises:

creating a clear area on every side of each of the target features, the length of the clear area depending on the length of the gate.

13. The method of claim 12 wherein the width of the clear area is specified by a user.

14. A set of masks with definitions created by reading at least a portion of an initial layout of an integrated device layer, identifying one or more target features within the initial layout, creating a first revised layout definition for a first mask, the first revised layout definition including the one or more target features and adjacent clear areas inside dark-field content, and creating a second revised layout definition for a second mask, the second revised layout definition including one or more dark features inside bright-field content, wherein the one or more dark features, when used in a multiple exposure fabrication process, will overlap the one or more target features.

15. The set of masks of claim 14 wherein each of the first mask and the second mask is any one of a binary mask and an attenuated phase-shifting mask.

16. The set of masks of claim 14 wherein each of the one or more dark features of the second revised layout definition covers each of the one or more target features of the first revised layout definition and the corresponding adjacent clear areas.

17. The set of masks of claim 16 wherein the one or more target features represent two target features positioned at a distance from each other.

18. The set of masks of claim 17 wherein the distance is below a first limit associated with an isolated pattern.

19. The set of masks of claim 18 wherein the dark feature of the second revised layout definition covers an area beginning with a leftmost clear area adjacent to a first target feature of the two target features and ending with the rightmost clear area adjacent to a second target feature of the two target features.

20. The set of masks of claim 18 wherein the distance is between the first limit associated with the isolated pattern and a second limit associated with a dense pattern.

21. The set of masks of claim 20 wherein the definitions are created further by adding one or more assist features between the two target features in the first revised layout definition.

22. The set of masks of claim 21 wherein the definitions are created further by adding a clear area corresponding to any of the one or more assist features within the dark feature of the second revised layout definition when the width of the any of the one or more assist features exceeds a predefined threshold.

23. The set of masks of claim 14 wherein each of the one or more target features corresponds to a gate of a transistor.

24. An integrated device layer, created by exposing a photoresist applied on a wafer to a first mask created by a first layout definition and thereafter to a second mask created by a second layout definition, and processing the photoresist, wherein:

the first layout definition comprises one or more target features from an initial layout of the integrated device layer and adjacent clear areas inside dark-field content; and the second layout definition comprises one or more dark features inside bright-field content, the one or more dark features overlapping the one or more target features when being used in a multiple exposure fabrication process.

25. The integrated device layer of claim 24 wherein each of the first mask and the second mask is any one of a binary mask and an attenuated phase-shifting mask.

26. The integrated device layer of claim 24 wherein each of the one or more dark features of the second layout definition covers each of the one or more target features of the first layout definition and the corresponding adjacent clear areas.

27. The integrated device layer of claim 26 wherein the one or more target features represent two target features positioned at a distance from each other.

28. The integrated device layer of claim 27 wherein the distance is below a first limit associated with an isolated pattern.

29. The integrated device layer of claim 28 wherein the dark feature of the second layout definition covers an area beginning with a leftmost clear area adjacent to a first target feature of the two target features and ending with the rightmost clear area adjacent to a second target feature of the two target features.

30. The integrated device layer of claim 28 wherein the distance is between the first limit associated with the isolated pattern and a second limit associated with a dense pattern.

31. The integrated device layer of claim 30 wherein the first layout definition further includes one or more assist features between the two target features.

32. The integrated device layer of claim 31 the second layout definition further includes a clear area corresponding to any of the one or more assist features within the dark feature of the second layout definition if the width of the any of the one or more assist features exceeds a predefined threshold.

33. The integrated device layer of claim 24 wherein each of the one or more target features corresponds to a gate of a transistor.

34. A computer readable medium comprising executable instructions which when executed on a processing system cause said processing system to perform a method comprising:
   reading at least a portion of an initial layout of an integrated device layer;
   identifying one or more target features within the initial layout;
   creating a first revised layout definition associated with a first mask, the first revised layout definition including the one or more target features and adjacent clear areas inside dark-field content; and
   creating a second revised layout definition associated with a second mask, the second revised layout definition including one or more dark features inside bright-field content, wherein the one or more dark features, when used in the multiple exposure fabrication process, will overlap the one or more target features.

35. A method for separating an initial layout of an integrated circuit device into a set of layout definitions for use in a multiple exposure fabrication process, the method comprising:
   reading at least a portion of the initial layout;
   identifying two or more target features within the initial layout that are positioned at a distance from each other that is below a limit associated with an isolated pattern;
   creating a first revised layout definition for a first mask, the first revised layout definition including the two or more target features surrounded by clear areas inside dark-field content; and
   creating a second revised layout definition for a second mask, the second revised layout definition including one or more dark features inside bright-field content, wherein the one or more dark features, when used in the multiple exposure fabrication process, will overlap the two or more target features and at least a portion of the corresponding clear areas.

36. The method of claim 35 wherein each of the first mask and the second mask is any one of a binary mask and an attenuated phase-shifting mask.

37. The method of claim 35 wherein the second revised layout definition further includes features from the initial layout that are not present in the first revised layout definition inside the bright-field content.

38. The method of claim 35 wherein each of the one or more target features corresponds to a gate of a transistor.

39. The method of claim 38 wherein creating the surrounding clear areas comprises:
   creating a clear area on every side of each of the target features, the length of the clear area depending on the length of the gate.

40. The method of claim 39 wherein the width of the clear area is specified by a user.

41. The method of claim 35 wherein the dark feature of the second revised layout definition covers an area beginning with a leftmost clear area adjacent to a first target feature of the two target features and ending with the rightmost clear area adjacent to a second target feature of the two target features.

42. The method of claim 35 wherein the distance is between the first limit associated with the isolated pattern and a second limit associated with a dense pattern.

43. The method of claim 42 further comprising:
   adding one or more assist features between the two target features in the first revised layout definition.

44. The method of claim 43 further comprising:
   adding a clear area corresponding to any of the one or more assist features within the dark feature of the second revised layout definition when the width of the any of the one or more assist features exceeds a predefined threshold.

45. A set of masks with definitions created by reading at least a portion of an initial layout of an integrated device layer, identifying two or more target features within the initial layout that are positioned at a distance from each other that is below a limit associated with an isolated pattern, creating a first revised layout definition for a first mask, the first revised layout definition including the two or more target features surrounded by clear areas inside dark-field content, and creating a second revised layout definition for a second mask, the second revised layout definition including one or more dark features inside bright-field content, wherein the one or more dark features, when used in a multiple exposure fabrication process, will overlap the two or more target features and at least a portion of the corresponding clear areas.

46. The set of masks of claim 45 wherein each of the first mask and the second mask is any one of a binary mask and an attenuated phase-shifting mask.

47. The set of masks of claim 45 wherein each of the one or more dark features of the second revised layout definition covers each of the one or more target features of the first revised layout definition and at least a portion of corresponding clear areas.

48. The set of masks of claim 45 wherein each of the one or more target features corresponds to a gate of a transistor.

49. The set of masks of claim 45 wherein the dark feature of the second revised layout definition covers an area beginning with a leftmost clear area adjacent to a first target feature of the two target features and ending with the rightmost clear area adjacent to a second target feature of the two target features.

50. The set of masks of claim 45 wherein the distance is between the first limit associated with the isolated pattern and a second limit associated with a dense pattern.

51. The set of masks of claim 45 wherein the definitions are created further by adding one or more assist features between the two target features in the first revised layout definition.

52. The set of masks of claim 51 wherein the definitions are created further by adding a clear area corresponding to any of the one or more assist features within the dark feature of the second revised layout definition when the width of the any of the one or more assist features exceeds a predefined threshold.

53. An integrated device layer, created by exposing a photoresist applied on a wafer to a first mask created by a first layout definition and thereafter to a second mask created by a second layout definition, and processing the photoresist, wherein:

the first layout definition comprises two or more target features from an initial layout of the integrated device layer that are separated by a distance that is less than a limit associated with isolated patterns and are surrounded by clear areas inside dark-field content; and the second layout definition comprises one or more dark features inside bright-field content, the one or more dark features overlapping the two or more target features and at least a portion of the corresponding clear areas when being used in a multiple exposure fabrication process.

54. The integrated device layer of claim 53 wherein each of the first mask and the second mask is any one of a binary mask and an attenuated phase-shifting mask.

55. The integrated device layer of claim 54 wherein the dark feature of the second layout definition covers an area beginning with a leftmost clear area adjacent to a first target feature of the two target features and ending with the rightmost clear area adjacent to a second target feature of the two target features.

56. The integrated device layer of claim 54 wherein the distance is between the first limit associated with the isolated pattern and a second limit associated with a dense pattern.

57. The integrated device layer of claim 54 wherein the first layout definition further includes one or more assist features between the two target features.

58. The integrated device layer of claim 54 the second layout definition further includes a clear area corresponding to any of the one or more assist features within the dark feature of the second layout definition if the width of the any of the one or more assist features exceeds a predefined threshold.

59. The integrated device layer of claim 53 wherein each of the one or more target features corresponds to a gate of a transistor.

60. A computer-readable medium comprising executable instructions which when executed on a processing system cause said processing system to perform a method comprising:

reading at least a portion of an initial layout of an integrated device layer; identifying two or more target features within the initial layout separated by a distance that is less than a limit associated with isolated patterns;

creating a first revised layout definition associated with a first mask, the first revised layout definition including the one or more target features surrounded by clear areas inside dark-field content; and creating a second revised layout definition associated with a second mask, the second revised layout definition including one or more dark features inside bright-field content, wherein the one or more dark features, when used in the multiple exposure fabrication process, will overlap the two or more target features and at least a portion of the corresponding clear areas.

61. A computer-readable medium on which data is stored for defining a first and second mask for creating at least one target feature defined in an initial layout of an integrated circuit device with a multiple exposure fabrication, the medium including:

data representing a first mask including a dark feature and clear areas adjoining the dark feature within a dark-field that correspond to the target feature in the initial layout; and data representing a second mask including a feature within a bright-field, wherein the feature of the second mask covers the dark feature and at least a portion of the clear areas adjoining the dark feature when used in a multiple exposure process.

62. The computer-readable medium of claim 61, wherein the data representing the first mask further includes data representing a second dark feature and clear areas adjoining the second dark feature that corresponds to a second target feature that is within a predetermined distance of the first target feature, wherein the feature in the second mask covers both dark features and at least a portion of the adjoining clear areas in the first mask when used in a multiple exposure process.

63. The computer-readable medium of claim 62, wherein the data for the first mask further includes data representing one or more assist features that are between the first and second dark features that correspond to the first and second target features.

64. The computer-readable medium of claim 63, wherein the feature in the second mask includes a bright-field opening aligned with the one or more assist features on the first mask.

65. A method for separating an initial layout of an integrated circuit device into a set of layout definitions for use in a multiple exposure fabrication process, comprising:

reading at least a portion of the initial layout;

identifying one or more target features within the initial layout that require fabrication with a multiple exposure fabrication process;

creating a first revised layout definition for a first mask; the first revised layout definition including dark features with adjacent clear areas inside a dark-field that correspond to each of the target features requiring fabrication with a multiple exposure process; and creating a second revised layout definition for a second mask, the second revised layout definition including dark features in a bright-field that overlap the dark features and at least a portion of the adjacent clear areas that correspond to the target features in the first mask when used in a multiple exposure fabrication process and dark features in a bright-field that correspond to features from the initial layout that do not require a multiple exposure fabrication process.

66. A computer-readable medium of which data is stored for creating a first and second mask to create a layout of an integrated circuit device with a multiple exposure process, the medium containing:

data representing dark features and adjacent clear areas within a dark-field that correspond to target features within the layout requiring fabrication with a multiple exposure process; and data representing dark features within a clear field that overlap the dark features and at least a portion of the adjacent clear areas corresponding to the target features and data representing dark features within the clear field that correspond to features in the layout of the integrated circuit that do not require fabrication with a multiple exposure process.

* * * * *